United States Patent [19]

Tamaoki et al.

[11] Patent Number: 4,740,450
[45] Date of Patent: Apr. 26, 1988

[54] METHOD OF MAKING IMAGE REPRODUCING MATERIAL HAVING SCRATCH IMPROVMENT

[75] Inventors: Nobuyuki Tamaoki; Yoshio Katoh; Akitada Osako; Toshihiko Kajima, all of Ohtsu; Shinichi Tanaka, Shiga, all of Japan

[73] Assignee: Toyo Boseki Kabushiki Kaisha, Osaka, Japan

[21] Appl. No.: 1,285

[22] Filed: Jan. 8, 1987

Related U.S. Application Data

[60] Continuation-in-part of Ser. No. 806,908, Dec. 9, 1985, abandoned, which is a division of Ser. No. 649,028, Sep. 10, 1984, abandoned.

[30] Foreign Application Priority Data

Sep. 13, 1983 [JP] Japan ................................. 58-170489

[51] Int. Cl.$^4$ .............................................. G03C 1/68
[52] U.S. Cl. ..................................... 430/273; 430/281; 430/523; 430/950; 430/961; 522/16; 522/78; 522/79; 522/121; 522/26; 524/322; 524/533; 524/318; 524/230; 524/250; 524/385
[58] Field of Search ............... 430/273, 281, 950, 961, 430/523; 522/16, 26

[56] References Cited

U.S. PATENT DOCUMENTS

| | | | |
|---|---|---|---|
| 3,203,805 | 8/1965 | Burg | 430/273 |
| 3,895,949 | 7/1975 | Akamatsu | 430/273 |
| 4,013,696 | 3/1977 | Babbitt et al. | 430/951 |
| 4,069,053 | 1/1978 | Mayama | 430/950 |
| 4,142,894 | 3/1979 | Hori et al. | 430/950 |
| 4,333,998 | 6/1982 | Leszyk | 430/277 |
| 4,347,303 | 8/1982 | Asano et al. | 430/273 |

*Primary Examiner*—Jack P. Brammer

[57] ABSTRACT

An image reproducing material which comprises a support and at least a photosensitive resin layer and scratch resistance layer borne on the support, said scratch resistance layer containing a compound represented by AmBn, wherein A is mono- or divalent, straight or branched $C_{11-20}$ aliphatic hydrocarbon; B is hydrogen, hydroxyl, amino, nitrile, aldehyde, carboxyl, or alkylamide, alkylester, ammonium salt or a periodic table group I–IV metal salt of a carboxylic acid; m is an integer of 1 to 3; and n is 1 or 2. A process for preparing the image reproducing material as well as a process for preparing an image reproduced material by using the image reproducing material are also described.

1 Claim, No Drawings

METHOD OF MAKING IMAGE REPRODUCING MATERIAL HAVING SCRATCH IMPROVMENT

This application is a continuation-in-part application of application Ser. No. 806,908 filed Dec. 9, 1985, now abandoned, which is a divisional application of application Ser. No. 649,028 filed Sept. 10, 1984 now abandoned.

The present invention relates to an image reproducing material and an image reproduced material which can provide an image having improved surface scratch resistance properties. Further, the present invention relates to processes for preparing these materials.

Image reproducing materials have heretofore been utilized in many fields, such as recording of information, preparation of printing plates, lithoprinting, printing and so on. Though they satisfy basic requirements such as resolving power and photosensitivity in each application, they have many defects which result in problems on the part of for users. For example, in applications under various conditions, a lot of scratches are generated, which require not only whole operations to be done over again but also a great loss of time and materials. Such insufficiency of scratch resistance properties of the surface of images is often observed in materials whose image carriers are formed by polymers, that is, in materials utilizing photosensitive resins as image reproducing materials.

On the other hand, an image reproducing material utilizing a photosensitive resin is very advantageous from the viewpoints of its photosensitivity, resolving power, safety and cost. Therefore, it has been long requested to overcome such insufficiency in scratch resistance properties. At present, only such techniques as afterbaking or resin-coating following image formation are employed to overcome the insufficiency. However, there can not be found any attempt to solve the insufficiency substantially by taking into consideration of the structure of an image reproducing material.

Under these circumstances, the present inventors have intensively studied a microstructure of an image reproducing material which can remarkably improve scratch resistance properties of images formed and have attained the present invention.

One object of the present invention is to provide an image reproducing material which can provide an image having improved surface scratch resistance properties.

Another object of the present invention is to provide a process for preparing the image producing material.

Still another object of the present invention is to provide a process for preparing an image reproduced material on which an image having improved surface scratch resistance properties is provided.

These objects as well as other objects and advantages of the present invention will become apparent to those skilled in the art from the following description.

According to the present invention, there is provided an image reproducing material which comprises a support and at least a photosensitive resin layer and scratch resistance layer borne on the support, said scratch resistance layer containing a compound represented by $A_mB_n$, wherein A is mono- or divalent, straight or branched $C_{11-20}$ aliphatic hydrocarbon; B is hydrogen, hydroxyl, amino, nitrile, aldehyde, carboxyl, or alkylamide, alkylester, ammonium salt or a periodic table group I-IV metal salt of a carboxylic acid; m is an integer of 1 to 3; and n is 1 or 2. The present invention also provides a process for preparing an image reproducing material by laminating or coating at least a photosensitive resin layer on a support which comprises incorporating a compound represented by the formula $A_mB_n$ wherein A, B, m and n are as defined above, into a photosensitive resin composition, forming a layer of the photosensitive layer composition onto the support, and then permitting the resultant article to stand so that the compound migrates onto the surface of the photosensitive resin layer. Further, the present invention provides a process for preparing an image reproduced material which comprises exposing and/or developing an image reproducing material having a support and at least a photosensitive resin layer and a protective layer borne on the support to obtain an image reproduced material, applying a solution containing a compound represented by $A_mB_n$ wherein A, B, m and n are as defined above, on the surface of the resulting image reproduced material or dipping the image reproduced material in the solution containing the compound to form a scratch resistance layer on the surface of the reproduced material.

Examples of the suitable support used in the image reproducing material of the present invention include glass plate, plastic film, metallic plate and paper. For a lithofilm, a transparent support such as glass plate or plastic film is used. As a plastic film, for example, there can be used polyester, poly-propylene, polyethylene, polyvinyl chloride, polyvinylidene chloride, polycarbonate, or cellulose acetate film. Particularly, a biaxially oriented polyester film is preferred because it is excellent in dimensional stability and transparency. Although thickness of the support is not limited to a specific one, from 75 to 125 μm is preferred.

In the present invention, a satisfactory result can be obtained even when the support is directly contiguous to the photosensitive resin layer. Particularly, when an adhesive compound which improves adhesion between the support and the photosensitive resin layer is impregnated in the support, a satisfactory result is obtained. However, in a more preferred embodiment of the image reproducing material of the present invention, an undercoat layer is generally provided between the support and the photosensitive resin layer. As the undercoat layer, there can be used a thin layer of a polymer or a thin layer of a metal or a metallic compound.

Preferred examples of the thin layer of a polymer are films of polyacrylate, polyvinylidene chlorideacrylonitrile-itaconic acid copolymer, vinyl chloride-vinyl acetate-maleic acid anhydride copolymer, terephthalic acid-isophthalic acid-glycol copolymer and isocyanate compound. The thickness of the layer is in general in a range from 0.2 to 2 μm.

Preferred metals or metallic compounds suitable for the undercoat layer are aluminum, polonium, iron, magnesium, silicon, titanium, cobalt, copper, indium, iridium, lead, manganese, molybdenum, nickel, palladium, platinum, rhodium, selenium, silver, tantalum, tin, tungusten, vanadium, zinc, zirconium, and their alloys, oxides, nitrides, borides, carbides, sulfides and salts. Examples of the metallic compound are aluminium oxide, magnesium fluoride, titanium oxide, silicon oxide, aluminum-zinc alloy and the like. Among the above metallic compounds, aluminum and its alloys or compounds are most preferred because of their lower costs and of higher etching speeds in aqueous solvents. In order to provide the thin layer of the metal or metallic compound on the support, there can be employed such techniques as plating, vacuum deposition, sputtering, ionization electrostatic plating and the like. The thickness of the metal or metallic compound layer is, though varying with the kind of metal or metallic compound used, etc., in general in a range from 100 to 1,000 Å, and preferably, from 300 to 600 Å.

The photosensitive resin used in the present invention is a resin composition which produces a rapid physical or chemical change with actinic light irradiation. Representative examples of photochemical reactions generally used for this purpose include photolysis insolubilization, photolysis solubilization, photo-crosslinking reaction and photopolymerization. In addition to these reactions, free radical development, diazo color development and diazo gas blowing reactions can be also employed. The present invention is very useful because it can be adapted to any photosensitive resin utilizing any type of photochemical reaction.

A representative example of a photosensitive resin utilizing the above photolysis insolubilization is a condensed product of 4-diazo-1,1'-diphenylaminesulfide and paraformaldehyde and a representative example of a photosensitive resin utilizing photolysis solubilization is a mixture of a quinone azide such as naphthalene-1,2-quinone azide derivative and novolak. As the photo-crosslinking type photosensitive resin, that containing ciannamoyl or cinnamilidene group in its polymer structure is well known. The above photopolymerization type photosensitive resin is that mainly composed of a monomer or an oligomer having ethylenically unsaturated bond in a polymer binder and a photo-initiator and many examples thereof can be seen in photosensitive resin printing matrixes and various kinds of image reproducing materials. In the present invention, these various kinds of photosensitive layers may be visually transparent or they may contain coloring materials such as dyes or pigments, or light screens and, in either case, the desired result of the present invention can be obtained.

In the present invention, the most effective result can be obtained from the image reproducing material having such a photosensitive resin layer that, when the image reproducing material is exposed to a light to form an image and the readily soluble part thereof is removed, it provides an image reproduced material having an image reproduced area composed of a hardened upper layer and an unhardened lower layer.

By the way, an image reproduced material of this kind is liable to be destroyed by scratching on the surface due to the presence of the unhardened lower layer and such kind of an image reproduced material has hitherto been hardly fit for practical use. However, according to the present invention, it is possible to obtain an image reproduced material having an unhardened lower layer which is fit for practical use.

The photosensitive resin layer which constitutes the above image reproducing material for providing an image reproduced material having an unhardened lower layer is that of a photopolymerization type and comprises a photo-initiator, a monomer and a binder and further, it contains as an essential ingredient a coloring material or a light screen which can serve as an actinic light irradiation absorbing agent and, if necessary, a stabilizer, a plasticizer, a surface active agent and so on.

Each component of the above photosensitive resin layer is further illustrated in detail below.

(a) Photo-initiator

The photo-initiator is a material being capable of initiating polymerization and crosslinking reactions with irradiation of an actinic light and it can be used alone or in a combination with another compound. Representative examples thereof include benzophenone derivatives such as benzyl, benzophenone, Michler's ketone, 4,4-bis(diethylamino)benzophenone, 4-methoxy-4'-dimethylaminobenzophenone, etc.; aromatic ketones such as anthraquinone, 2-chloroanthraquinone, 2-ethylanthraquinone, 1-chloroanthraquinone, phenanthraquinone, etc.; benzoin derivatives such as benzoin, benzoin-alkyl ethers, α-methylbenzoin, benzyldimethylketal-polynuclear quinones, etc.; a combination of a 2,4,5-triarylimidazole dimer with a free radical producing agent; and the like. Addition of a sensitizer or a sensitizing dye further improves the sensitivity. As a 2,4,5-triarylimidazole dimer, there can be exemplified triphenylimidazole dimers such as 2-(o-methoxyphenyl)-4,5-diphenylimidazole dimer, 2-(o-chlorophenyl)-4,5-diphenylimidazole dimer, 2-(p-methylmercaptophenyl)-4,5-diphenylimidazole dimer, etc.; and polycyclicaryl-4,5-diphenylimidazole dimers such as 2-(1-naphthyl)-4,5-diphenylimidazole dimer, 2-(9-anthryl)-4,5-diphenylimidazole dimer, 2-(2-methoxy-1-naphthyl)-4,5-diphenylimidazole dimer, 2-(2-methoxy-1-naphthyl)-4,5-(o-methoxyphenyl)imidazole dimer, 2-(2-chloro-1-naphthyl)-4,5-diphenylimidazole dimer, etc.

Examples of the free radical producing agent used in the combination with the 2,4,5-triarylimidazole dimer include p-aminophenyl ketone compounds such as p,p'-bis(dimethylamino)benzophenone, etc.; Leucotriphenylmethane dyes such as Leuco Malachite Green, Leuco crystal violes, etc.; cyclic diketones such as 2,4-diethyl-1,3-cyclobutanedione, etc.; thioketones such as 4,4'-bis(dimethylamino)benzophenone, etc.; mercaptan compounds such as 2-mercaptobenzothiazole, etc.; N-phenylglycyne; dimedone; 7-diethylamino-4-methyl coumarin; and the like.

As the sensitizer or sensitizing dye, coloring material such as xanthene, acridine, thiazine, cyanine are useful.

(b) Monomer

As the monomer, that containing one or more polymerizable double bonds can be used. Examples of such compound include alkyl acrylates or alkyl methacrylates such as hexyl acrylate, hexyl methacrylate, cyclohexyl acrylate, cyclohexyl methacrylate, lauryl acrylate lauryl methacrylate, benzyl acrylate, benzyl methacrylate, etc.; hydroxyalkylacrylates; hydroxyalkylmethacrylates; N,N-dialkylaminoalkylacrylates or methacrylates; alkyletheracrylates or methacrylates such as methoxyethylacrylate, ethoxyethylmethacrylate, etc.; halogenated alkyl acrylates or methacrylates; alkylacryl or methacrylamides; hydroxyalkylacrylates or methacrylates; polyalkylether acrylates or methacrylates such as diethylene glycol diacrylate or dimethacrylate, triethylene glycol diacrylate or dimethacrylate, etc.; ethylene glycol diacrylate or dimethacrylate; acrylates or methacrylates of polyhydric alcohols such as glycerol, trimethylolpropane, pentaerythritol, etc.; reaction products of acrylic acid, methacrylic acid, or glycidyl aclylate or methacrylate and active hydrogen-containing compound; reaction products of glycidyl compounds and acrylic acid or methacrylic acid; condensates of N-methylol compounds and urea compounds; reaction products of polyisocyanate compounds and hydroxyalkyl acrylates or methacrylates; and the like.

The monomer used is not limited to a specific kind and it is necessary to select the monomer to be used according to a particular kind of a binder, ratio of the monomer, kind and amount of a photo-initiator, an actinic light absorbing agent and the like and it can be determined based on its compatibility, film forming properties, stability, photosensitivity and so on. It is preferable to use the monomer having a high boiling point because, when the boiling point thereof is low, it evaporates during or after film formation to cause undesirable decrease of its volume.

(c) Binder

The binder is required to be a solid organic polymeric material at a temperature lower than 50° C. which is soluble in a solvent and to be compatible with the polymerizable monomer. Although the binder may be either thermoplastic or not, it is required to have film forming properties, particularly, it is required to maintain such properties even after addition of the monomer, the photo-initiator and the actinic light absorbing agent as described hereinafter.

Examples of the binder include cellulose esters, ethers and derivatives containing both cellulose esters and ethers (e.g., cellulose ethyl ether, cellulose acetate, carboxymethylcellulose, cellulose acetate succinate, cellulose methylether phthalate, cellulose methylether succinate, etc.), polyalkylethers, polyesters, polyamides, polyvinylesters and copolymers thereof, phenol resins, polyvinylidene compounds, polyvinyl alcohols, gelatin and derivatives thereof, polyvinyl butyrals, polyacrylamide, polyvinyl pyrrolidone, polystyrenes, chlorinated rubber, polyethylene imine and the like.

Particularly, in order to make development with an aqueous developer possible, it is necessary that the binder itself can be dissolved or dispersed in the aqueous developer. Examples of such binder include polyvinyl alcohols, polyacrylamides, polymers containing sulfone group, acid quaternerized units of polymers containing tertiary nitrogen, polyvinylpyrrolidone, polyethylene imine and so on.

As an acidic or alkaline water soluble binder, there can be used cellulose derivatives having carboxyl group such as carboxymethylcellulose, cellulose methyl ether phthalate, cellulose methyl ether succinate, etc.; copolymers of acids (e.g., methacrylic acid, acrylic acid, maleic acid, itaconic acid, crotonic acid, etc.) and vinyl monomers; polyesters containing tertiary nitrogen; polyamides; polyethers; etc.

By the way, the above binder can contain a polymerizable unsaturated double bond in its main chain or side chain.

(d) Actinic light absorbing agent

In addition to the photo-initiator, a compound effective for absorption of actinic light can be included in the material and thereby image being opaque to actinic light can be formed. By increasing absorption of actinic light, hardening reaction proceeds only in the upper layer of an image part which had been exposed to the light through a transparent part of a mask, while the lower layer is kept in unhardened state. Thus, by keeping an unhardened lower layer thus formed, it is possible to keep reductivity which is an advantageous characteristic for using the material in lithofilm art. On the contrary, when absorption of actinic light is decreased, not only the upper layer but also the lower layer are hardened by exposure to the light, which results in the difficulty of subsequent reduction. Further, when absorption of actinic light is too much, only a very thin layer of the surface is hardened, which results in not only inferior resist effect but also lowering of photosensitivity. 1.5 To 4 of absorbance of actinic light in the photosensitive layer is most preferred.

As the actinic light absorbing agent, there can be used various kinds of ultraviolet absorbers, ultraviolet absorbing dyes and other kinds of dyes and pigments. Examples of these materials include powder materials such as carbon black, titanium oxide, iron oxide, other various kinds of metals or oxides or sulfides thereof, pigment black (C.1.50440), chrom yellow light (C.1.77603), 2,2'-hydroxy-4-methoxybenzophenone, 2,4-dihydroxybenzophenone hydroxyphenylbenzotriazol, 2-(2'-hydroxy-5'-methoxyphenyl)benzotriazol, resorchinol monobenzoate, ethyl 2-cyano-3,3-diphenylacrylate, toluidine yellow GW (C.I.71680), molybudenum orange (C.I.77605), Sudan Yellow (C.I.30), oil orange (C.I.12055) and so on. Particularly, carbon black is desirable to obtain the same black as silver salt used in a conventional method. Further, it is preferable to add a dye or a pigment when using a colorless ultraviolet absorber because an image part is indistinct. In the case of using an inorganic or organic pigment, a metal or a metallic compound, it is required to finely divide it by a physical or chemical method.

By the way, instead of incorporating the above actinic light absorbing agent into the photosensitive resin layer, the absorbing agent can be included in the undercoat layer to form a colored image reproducing material.

In the present invention, the thickness of the photosensitive resin layer is preferably 1–6 μm in the case of not only obtaining the above image reproduced material having the hardened upper layer and the unhardened lower layer but also using it in reproducing a precise image. However, in case of the image reproducing material for a special use such as photosensitive resin letterpress or a photosensitive resin letterpress material for preparing a paper mold or a matrix, of course, the desired result can be obtained, even if the thickness of the photosensitive resin layer reaches to several hundreds μm.

Next, the scratch resistance layer in the present invention is illustrated in detail. In the compound which forms the layer represented by the formula AmBn (hereinafter referred to as the scratch resistance improver), A is mono- or divalent, straight or branched, $C_{11-20}$ aliphatic hydrocarbon. B is hydroxyl, amino, nitrile, aldehyde, carboxy, or alkylamide, alkylester, ammonium salt or a periodic table group I–IV metal salt of a carboxylic acid, m is 1, 2 or 3 and n is 1 or 2. As the scratch-resistance improver, there can be used a mono- or dicarboxylic acid of an aliphatic hydrocarbon, for example, lauric acid, n-tridecylenic acid, myristic acid, n-pentadecanoic acid, palmitic acid, n-heptadecanoic acid, heptadecanoic acid, stearic acid, oleic acid, linolic acid, elaidic acid, n-nonadecylic acid, arachic acid, paraxic acid, eicosanoic acid, trans-2-dodecenoic acid, isostiaric acid, 2-nonaheptylundecanoic acid, 1,16-hexadecanedioic acid, 1,20-eicosanedioic acid or the like. Examples of a derivative of the above carboxylic acid of an aliphatic hydrocarbon include salts with periodic table group I–IV metals and alkyl esters and examples of the alkyl ester include esters of the above carboxylic acids with alcohols such as methanol and ethanol and those with polyhydric alcohols such as glycol and glycerin, for example, glycol laurate, glycerin laurate, glycol myristate, glycol palmitate, glycerin palmitate, glycol stearate, glycol distearate and glycerin stearate are available. Further, as a vinyl ester, there can be used vinyl stearate. As another carboxylic acid derivative, an alkyl amide is also available. Examples of the alkyl amide include laurinamide, dodecylamide, palmitinamide, 2-heptadecenamide, stearinamide and arachinamide. This alkyl amide may include distearimide, N,N-distearylurea and ethylenebisstearamide. Further, other examples of the scratch-resistance improver include liquid paraffin, aliphatic alcohol, aldehyde, amine and nitrile. Examples of the alcohol are lauryl alcohol, dodecyl alcohol, myristyl alcohol, pentadecyl alcohol, heptadecyl alcohol, stearyl alcohol, nonadecyl alcohol, arachinyl alcohol and the like. Examples of the aldehyde are lauryl aldehyde, dodecyl aldehyde, myristyl aldehyde, pentadecyl aldehyde, tridecyl aldehyde, heptadecyl aldehyde, stearyl aldehyde and the like. Examples of the amine are lauryl amine, myristyl amine, pentadecyl amine, stearyl amine and the like. Examples of the nitrile are lauryl nitrile, palmito nitrile, stearo nitrile and the like. These compounds can be used alone or in a combination thereof.

By the way, the preferred scratch resistance improvers used in the present invention are those wherein A is monovalent $C_{11-20}$ aliphatic hydrocarbon and B is carboxyl. Representative examples thereof are stearic acid, lauric acid, tridecylic acid, myristic acid, heptadecanoic acid, palmitic acid, pentadecanoic acid, heptadecanoic acid, nonadecanoic acid, arachic acid, n-heneicosanoic acid and alkyl esters thereof.

The layer comprising the scratch resistance improver in the present invention can be most effective when it is mono- or multilayer of the improver, but, in order to obtain sufficient scratch resistance properties for practical use, it is not necessarily required that the layer be a high density layer of the scratch resistance improver such as a monolayer thereof. The amount of the scratch resistance improver which forms the scratch resistance layer can be quantitatively analyzed by surface spectroscopic analyses such as photoelectron spectroscopy and raman spectroscopic analyses or by liquid chromatography and gas chromatography of the selectively scraped layer. The present inventors have studied the necessary amount of the improver in the layer by using these analyses. As a result, it has been found that, in order to improve scratch resistance properties, the preferred amount of the improver in the scratch-resistance layer is in the range from $3 \times 10^{-7}$ mol to $1.75 \times 10^{-3}$ mol per 1 $m^2$. Although the amount of more than $1.75 \times 10^{-3}$ mol/$m^2$ is very effective for improvement of scratch resistance, it is not preferable from the point of reproducing precision (e.g., resolving power, etc.) of the image reproducing material. On the other hand, when the amount is less than $3 \times 10^{-7}$ mol/$m^2$, improvement in scratch resistance to be expected is insufficient from the practical point of view.

The above layer comprising the scratch resistance improver in the present invention can be formed directly on the photosensitive resin layer by coating a solution of the scratch resistance improver on the photosensitive resin layer and drying, or by using vacuum deposition. Alternatively, it can be formed by, for example, providing a protective overcoat layer containing the scratch resistance improver on the photosensitive resin layer. Particularly, the most effective process is that, where the scratch resistance improver is added to a composition for preparing the photosensitive resin layer, the layer is formed on the support with or without the undercoat layer by heat fusion extrusion or molding (film formation) by means of solution coating and drying, etc. and then the resultant is permitted to stand so that the scratch resistance improver migrates in the resulting photosensitive resin layer toward the surface thereof to form the scratch resisting layer. When such method is employed, the amount of the scratch resistance improver based on the total amount of the photosensitive resin composition should be 0.35 to 10% by weight, preferably 0.4 to 5% by weight. When the amount is less than 0.35% by weight, substantial improvement of scratch resistance properties can hardly be expected because of remarkable decrease of migration toward surface of the photosensitive resin later. When the amount exceeds 10% by weight, apparently, scratch resistance properties are improved but the scratch resistance improver layer becomes excessively thick, which leads to light scattering or shielding and, therefore, it is undesirable in view of reproducing precision of the image reproducing material.

As described above, when the scratch resistance layer is formed on the surface of the photosensitive resin layer by incorporation of the scratch resistance improver into the photosensitive resin composition, molding or forming of it into film and subsequently occurrence of migration of the improver in situ in the formed photosensitive resin layer, the photosensitive resin layer should be in a dried state. That is, it contains less than 100 ppm of a coating solvent, water, etc. and the layer should have such flexibility that the photosensitive resin allows migration of the scratch resistance improver at room temperature or a temperature of lower than 60° C. Such flexibility of the photosensitive resin layer can be measured by molding the photosensitive resin composition into a film of 20 to 30 μm in thickness, subjecting the film to thermo mechanical analysis (TMA) in a dry state, plotting elongation of the film against temperature and determining a fluidizing point which is defined as the intersection point between a tangent line at a steeply rising straight line portion after passing through an inflection point of the elongation curve and the temperature axis [Polymer reviews 38 479 (1981)].

In the present invention, when the scratch resistance layer is formed by incorporation of the scratch resistance improver into the photosensitive resin layer, molding or forming of it into film and then migration of the improver, the critical temperature of a fluidizing point of the photosensitive resin layer is 95° C. or lower. If it exceeds 95° C., it is not practical because of extreme delay of migration.

Further, in the present invention, in addition to the above described method for improving scratch resistance properties of an image, there can be also used a method such that an image reproduced material having an image information or a latent image thereof obtained by exposure to light and/or development of an image is treated with a solution containing the scratch resistance improver by wiping the surface of the image reproduced material with a cloth or the like which is impregnated with the solution as surface cleaning in a photoengraving process or by dipping the material in the solution to form the scratch resistance improver layer. By the way, in another aspect of the present invention, the same result can be obtained by spraying the above solution on an image reproduced surface. Particularly, in a preferred aspect of the present invention which is advantageous for the steps for developing an image after formation of a latent image, the scratch resistance improver can be add to a solution used in a conventional process for developing an image from a latent image such as a developer, a fixer or a washing solution and, thereby, the scratch resistance improvement can be simultaneously conducted during conventional processing. By the way, the processing can be carried out by a complete dry process (without any wet treatment) depending upon the kind of an image reproducing material and, in such a case, the above effect can be attained by providing an additional wet process of the scratch resistance improving treatment during the dry process.

As a solvent for preparing the above solution containing the scratch resistance improver, there can be used any solvent in which the improver can be dissolved. Examples of the solvent are water, alkaline aqueous solutions, acidic aqueous solutions, alcohols (e.g., methanol, ethanol, propyl alcohol, etc.), ether, benzene, toluene, xylene, petroleum ether, acetone, methylehylketone, ethyl acetate, chloroform, 1,1,1-trichloroethane, dichloroethane, dichloroethylene, tetrachlotoethane, carbontetrachloride and the like. The concentration of the scratch resistance improver in the solution is not limited to a specific one.

In the present invention, in order to protect the surface or, to prevent inhibition of photopolymerization of the photosensitive resin layer by oxygen, particularly, in the case of the layer being photopolymerizable, the photosensitive resin layer can be coated with a releasable protective overcoat film having good transparency or a protective film which is soluble in an aqueous solvent. Therefore, a resin which is soluble in an aqueous solvent such as polyvinyl alcohol, polyacryic acid, methyl cellulose and the like can be used. Particularly, polyvinyl alcohol is preferred because it has good oxygen barrier properties and can reduce the radical polymerization inhibiting effect of oxygen. In addition, as an ingredient of the protective overcoat layer, cationic and nonionic surface active agents can be preferably added in a total amount of 0.5 to 10%, more preferably, 1 to 7% by weight based on the above polymer material and thereby the protective overcoat layer can be applied uniformly. As the cationic surface active agent, there can be used alkyl amine halogeno acid salts, quaternary ammonium salts, pyridinium alkylhalides, alkyl betaines, amine oxides and the like. Representative examples thereof include coconut amine acetate, stearylamine acetate, stearylamine hydrochloride, stearylamine oleate, laurylamine oleate, lauryl trimethyl ammonium chloride, stearyl trimethyl ammonium chloride, alkyl benzyl dimethyl ammonium chloride, lauryl betaine, stearyl betaine and lauryl dimethyl amine oxide.

As the nonionic surface active agent, there can be used polyethylene glycols and polyhydric alcohols. Examples thereof are polyethylene glycol-nonyl phenyl ether, polyethylene glycol-octyl phenyl ether, polyethylene glycol-dodecyl oleyl ether, polyethylene glycol-lauryl ether, polyethylene glycol-stearyl ether, polyethylene glycol-higher fatty alcohol ether, polypropylene glycol-polyethylene glycol ether, sorbitan sesquioleate, sorbitan mono-oleate, polyethylene glycol alkylamine ether and the like.

By the way, the ratio of the above cationic surface active agent to the nonionic active agent is preferably in a range from 1:10 to 5:1. When the amount of the cationic surface active agent is decreased, i.e. less than 1:10 (weight ratio), adhesion between the protective layer and the photosensitive resin layer is insufficient and, when the ratio is more than 5:1, surface scratch resistance properties of the material after reproduction of an image is not as improved as expected. Further, as to the total amount, if it is less than 0.5% by weight, it is difficult to effect coating uniformly and, on the other hand, if it is more than 10 wt %, though sufficient effect can be expected, the balance between oxygen transmission, transparency and the other properties deteriorates.

In addition to the above polymer material and the combination of the surface active agents, the protective overcoat layer used in the present invention can contain a third ingredient such as silica powder, polyethylene emulsion and the like.

As the method for reproducing images by using the image reproducing material of the present invention, when the photosensitve resin layer of the image reproducing material is that of a photo-setting type, that is, utilizing photolysis, photo-crosslinking or photopolymerization, the image reproducing material is contacted to a transparent copy and exposed to a super high pressure mercury vapor lamp or a metal halide lamp and the like rich in actinic radiation. Then, the material is developed by a developer. When a protective overcoat film is present, it is peeled off. If there is the protective overcoat layer, an unhardened part between the overcoat layer and the photosensitive resin layer which is not exposed to light is eluted. Subsequently, when a thin film of a metal or a metallic compound is utilized as the undercoat layer, the metal or the metallic compound, which is exposed by development of the photosensitive resin layer with an etching solution, is eluted to give a negative image wherein white and black are reversed compared to the printed copy. It is possible to obtain the desired objective image by treating the whole layers with a single combined solution of a developer for the photosensitive resin layer and an etching solution for the undercoat layer.

When the photolysis-solubilizing photosensitive resin is used, a part of the photosensitive resin layer subjected to photolysis with irradiation of an actinic light and the protective overcoat layer, if any, are eluted by a developer for the photosensitive resin layer. Subsequently, when a thin layer of a metal or a metallic compound is utilized as the undercoat layer, the metal or the metallic compound layer exposed by development of the photosensitive resin layer is eluted with an etching solution to obtain the same image as the printed copy. In this case, it is also possible to finish the image with a single combined solution of the developer and the etching solution.

The image reproducing material of the present invention can be used for various purposes such as a printing graphic arts film, so called lithofilm, a photomask, a color proof photosensitive film, lithographic presensitized plate and photosensitive resin letterpress printing material.

Particularly, when the image reproducing material of the present invention is the photopolymerizable type containing the actinic light absorbing agent and having the photosensitive resin layer which gives a reproduced image composed of the hardened upper layer and the unhardened lower layer by exposure to a light and developing the image, reduction (dot-etching) can be effected after the development, if necessary. The reduction process can be carried out by spraying the same solution as the developer or a diluted solution thereof or by rubbing the material with a sponge or a brush in the solvent. In general, it is preferable to effect a fixing process after development but before the reduction process. Such reducable image reproducing material is very preferred as a printing graphic art film and a color proof photosensitive film.

Due to the above aspects of the present invention, the following characteristics are present.

(1) The possibility of generation of scratches during the operation is greatly reduced due to remarkable improvement of surface scratch-resistance properties of the image after reproduction of an image.

(2) There is no risk of deterioration of image reproducing properties such as sensitivity, resolving power and developing properties.

(3) There is no adverse effect on shelf life which is an important property required for an image reproducing material.

(4) Even in a reducible image reproducing material, there is no adverse effect on reduction properties such as reducing ratio or speed.

(5) When an adhesive-backed tape is used, its adherence is not reduce.

The following examples further illustrate the present invention in detail but are not to be construed to limit the scope thereof.

EXAMPLE 1

A polyeseter film (thickness: 100 μm) was coated with a composition having the following formulation by a reverse roll coater and dried to prepare a polyester film having an undercoat layer (thickness: 0.5 μm).

| Ingredients | Parts by weight |
|---|---|
| Bairon 20S (saturated polyester adhesive manufactured by Toyo Boseki Kabushiki Kaisha) | 50 parts |
| Colonate L (manufactured by Nippon Polyurethane Kogyo) | 4 parts |
| U-Cat SA-No. 102 (manufactured by Sunabbot) | 0.1 part |
| Toluene | 80 parts |
| Methylethylketone | 20 parts |

Next, various photosensitive compositions were prepared by mixing and dispersing the ingredients in the following formulation and then each of them was coated on the above-prepared polyester film having the undercoat layer by a reverse roll coater to form a photosensitive resin layer (thickness: 3 μm) thereon.

| Ingredients | Parts by weight |
|---|---|
| Binder polymer shown in Table 1 | 41 parts |
| Carbon black | 12 parts |
| Crosslinking agent mixture shown in Table 1 | 34 parts |
| 2-(2-Chloro-1-naphthyl)-4,5-diphenylimidazole dimer | 8 parts |
| Scratch-resistance improver (stearic acid) | Shown in Table 1 |
| Hydroquinonemonomethylether | 0.03 part |
| Dimedone | 3 parts |
| Micheler's ketone | 2 parts |
| Methanol | 140 parts |
| Chloroform | 120 parts |
| Ethyl acetate | 80 parts |
| n-Propyl acetate | 40 parts |
| Isopropylalcohol | 40 parts |

Further, a protective overcoat layer composition of the following formulation was coated on each resulting film to prepare a photosensitive film having a protective overcoat layer (thickness of the protective layer: 1 μm).

| Ingredients | Parts by weight |
|---|---|
| Polyvinylalcohol (Saponification degree: 98.5%, Polymerization degree: 500) | 5 parts |
| Noigen EA-140 (manufactured by Daiichi Kogyo Seiyaku) | 0.2 part |
| Catiogen H (manufactured by Daiichi Kogyo Seiyaku) | 0.05 part |
| Methanol | 5 parts |
| Water | 90 parts |

A test negative film composed of a combination of a step guide with 21 steps (manufactured by Dainihon Screen Co.) and a dot image (150 l/in, halftone dot area ratio: 50%) was put on each resulting photosensitive film and it was exposed to a light for predetermined period of time by using a bright room printer(manufactured by ORC Co.) to form an image. After the protective overcoat layer was removed by washing with water, the film was dipped in (A) 0.75% aqueous $Na_2CO_3$ solution or (B) 5% aqueous $Na_5P_3O_{10}$ solution adjusted to 30° C. for 10 seconds according to the kind of the film, rubbed with sponge while washing with water to develop the image and then dried to obtain a reversed image. It was found that hardening was completed by 5th step of the step guide and the dots reproduced the negative copy well.

Next, a reproduced dot image prepared in the same manner as described above was treated by dipping in 5% aqueous hydroquinone solution adjusted to 30° C. for 15 seconds, washing with water and drying.

The sample thus obtained was subjected to a loaded scratch test by using a surface properties tester Model Heidon-14 (manufactured by Shintokagaku KK) with a sapphire needle (0.1 mm in diameter) at a rate of 100 mm/min. The results are shown in Table 1. As is seen from Table 1, it was found that surface scratch resistance property of the image was remarkably improved by using the method of the present invention.

TABLE 1

| No. | Binder polymer | Cross-linking agent $C^{*(1)}:D^{*(2)}$ | Amount of stearic acid (parts) | Developer* | Scratch hardness (g) |
|---|---|---|---|---|---|
| 1 | Copolymer | 0:100 | 0 | A | 8 |
| 2 | of methyl | | 1.5 | | 250 |
| 3 | meth- | | 2.0 | | 300 |
| 4 | acrylate | | 3.0 | | 300 |
| 5 | (77 mol %) | 50:50 | 0 | | 10 |
| 6 | and meth- | | 1.5 | | 150 |
| 7 | acrylic | | 2.0 | | 250 |
| 8 | acid (2.3 mol %) | | 3.0 | | 250 |
| 9 | Copolymer | 0:100 | 0 | A | 8 |
| 10 | of methyl | | 1.5 | | 100 |
| 11 | meth- | | 2.0 | | 150 |
| 12 | acrylate | | 3.0 | | 150 |
| 13 | (73.5 mol %) | 50:50 | 0 | B | 10 |
| 14 | and meth- | | 1.5 | | 100 |
| 15 | acrylic | | 2.0 | | 250 |
| 16 | acid (26.5 mol %) | | 3.0 | | 300 |
| 17 | Copolymer | 0:100 | 0 | A | 8 |
| 18 | of methyl | | 1.5 | | 50 |
| 19 | meth- | | 2.0 | | 150 |
| 20 | acrylate | | 3.0 | | 150 |
| 21 | (70 mol %) | 50:50 | 0 | B | 10 |
| 22 | and meth- | | 1.5 | | 150 |
| 23 | acrylic | | 2.0 | | 250 |
| 24 | acid | | 3.0 | | 300 |

TABLE 1-continued

| No. | Binder polymer | Cross-linking agent C*(1):D*(2) | Amount of stearic acid (parts) | Developer* | Scratch hardness (g) |
|---|---|---|---|---|---|
| | (30 mol %) | | | | |

*: Developer for the image reproducing material
A: 0.75% aqueous sodium cabonate solution
B: 5% aqueous sodium tripolyphosphate solution
*(1)C: tetraethyleneglycol dimethacrylate
*(2)D: trimethylolpropane triacrylate

EXAMPLE 2

A surface of a polyester film (thickness: 100 μm) was washed and dried and then aluminum was deposited thereon in 500 Å thickness under vacuum of $10^{-5}$ Torr order with a resistance heating type vacuum metallizer.

Then, each photosensitive composition shown in Table 2 was prepared and coated on the above aluminum deposited polyester film by a reverse coater to form a photosensitive coating layer in 3 μm thickness thereon.

Further, on this film was coated a protective overcoat layer composition of the following formulation according to the same manner as described above to prepare a photosensitive film having a protective overcoat layer of 1 μm thick.

| Ingredients | Parts by weight |
|---|---|
| Polyvinylalcohol (Saponification degree: 98.5%, Polymerization degree: 500) | 5 parts |
| Noigen EA-140 (manufactured by Daiichi Kogyo Seiyaku) | 0.2 part |
| Methanol | 5 parts |
| Water | 90 parts |

A test negative film composed of a combination of a step guide with 21 steps (manufactured by Dainihon Screen Co.) and a dot image (150 l/in, halftone dot area ratio: 50%) was put on each resulting photosensitive film and it was exposed to a light for predetermined period of time by using a bright room printer (manufactured by ORC Co.). Then, after the protective overcoat layer was removed by washing with water, the film was dipped in (A) 0.75% aqueous $Na_2CO_3$ solution adjusted to 30° C. for 10 seconds and rubbed with a sponge while washing with water to develop and to remove the unexposure part of the photosensitive resin layer. The film thus treated was further dipped in a second developer, aqueous saturated calcium hydroxide solution (30° C.) for 3 minutes, washed with water, dipped in 5% aqueous hydroquinone solution (30° C.) for 15 seconds, washed with water and dried to obtain a sample for measuring scratch resistance.

The sample thus obtained was subjected to a loaded scratch test according to the same manner as in Example 1. The results are shown in Table 2. As is seen from Table 2, it was found that surface scratch resistance properties of the image was remarkably improved by using the method of the present invention.

TABLE 2

| Ingredients | Sample No. and weight parts | | | | | |
|---|---|---|---|---|---|---|
| | 25 | 26 | 27 | 28 | 29 | 30 |
| Copolymer of Methylmethacrylate (77 mol %), Methacrylic acid (23 mol %) | 15 | 15 | 0 | 0 | 0 | 0 |
| Copolymer of Methylmethacrylate (30 mol %), 2-Ethylhexylacrylate (40 mol %), Methacrylic acid (30 mol %) | 0 | 0 | 15 | 15 | 0 | 0 |
| Copolymer of Methacrylate (25 mol %), Methyacrylic acid (45 mol %), Laurylmethacrylate (30 mol %) | 0 | 0 | 0 | 0 | 15 | 15 |
| Trymethylolpropanetriacrylate | 12 | 12 | 12 | 12 | 12 | 12 |
| Dimedone | 1 | 1 | 1 | 1 | 1 | 1 |
| Qumarine | 0.5 | 0.5 | 0.5 | 0.5 | 0.5 | 0.5 |
| 2-(2-chloro-1-naphtyl)-4,5-diphenylimidazole dimer | 2.8 | 2.8 | 2.8 | 2.8 | 2.8 | 2.8 |
| Hydroquinonemonomethylether | 0.02 | 0.02 | 0.02 | 0.02 | 0.02 | 0.02 |
| Stearic acid | 0 | 0.9 | 0 | 0.9 | 0 | 0.9 |
| Acetone | 134 | 134 | 134 | 134 | 134 | 134 |
| Chloroform | 16 | 16 | 16 | 16 | 16 | 16 |
| Methylalcohol | 26 | 26 | 26 | 26 | 26 | 26 |
| Scratch hardness (g) | 40 | 200 | 70 | 275 | 90 | 325 |

EXAMPLE 3

A photosensitive layer (thickness: 3 μm) was prepared on the polyester film having the undercoat layer of Example 1 by coating a composition which is the composition No. 5 in Example 1 containing the compound shown in Table 3 with a reverse roller coater and drying. Further, a protective overcoat layer in 1 μm thickness was formed on this film according to the same manner as in Example 1. A sample for scratch resistance testing was prepared in the same manner as in Example 1 except that the developer (A) is used and its scratch hardness was determined. The results are shown in Table 3. As is seen from Table 3, all the scratch resistance improvers tested are effective.

TABLE 3

| Sample No. | Scratch resistance improver | Scratch resistance hardness (g) |
|---|---|---|
| 5 | without addition | 10 |
| 31 | Lauric acid | 25 |
| 32 | Methyl laurate | 50 |
| 33 | Lauryl alcohol | 75 |
| 34 | Lauryl amide | 75 |
| 35 | Lauryl amine | 75 |
| 36 | Ethyl palmitate | 125 |
| 37 | Isopropyl palmitate | 125 |
| 38 | Stearyl alcohol | 75 |
| 39 | Ethyl stearate | 75 |
| 40 | Oleic acid | 300 |
| 41 | Elaidic acid | 275 |
| 42 | Nonadecanoic acid | 325 |

TABLE 3-continued

| Sample No. | Scratch resistance improver | Scratch resistance hardness (g) |
|---|---|---|
| 43 | 2-n-heptylundecylenic acid | 50 |

EXAMPLE 4

Four kinds of image reproducing materials, A, B, C and D were prepared according to the following manner:

Image reproducing material A

A composition having the following formulation was coated on a polyester film (thickness: 100 μM) by a reverse roller coater and dried to prepare a polyester film with an undercoat layer of 0.5 μm thick.

| Ingredients | Parts by weight |
|---|---|
| Bairon 20S (saturated polyester adhesive manufactured by Toyo Boseki Kabushiki Kaisha) | 50 parts |
| Colonate L (manufactured by Nippon Polyurethane Kogyo) | 4 parts |
| U-Cat SA-No. 102 (manufactured by Sunabbot Co.) | 0.1 part |
| Toluene | 80 parts |
| Methylethylketone | 20 parts |

Then, a photosensitive composition was prepared by mixing and dispersing the ingredients of the following formulation and was coated on the above polyester film with an undercoat layer by a reverse roller coater to form a photosensitive resin layer in 3 μm thickness.

| Ingredients | Parts by weight |
|---|---|
| Copolymer of Methylmethacrylate (77 mol %) and Methacrylic acid (23 mol %) | 41 parts |
| Carbon black | 12 parts |
| Trimethylolpropanetriacrylate | 34 parts |
| 2-(2-Chloro-1-naphthyl)-4,5-diphenyl imidazole dimer | 8 parts |
| Hydroquinone monomethyl ether | 0.03 part |
| Dimedone | 3 parts |
| Michler's ketone | 2 parts |
| Methanol | 140 parts |
| Chloroform | 120 parts |
| Ethyl acetate | 80 parts |
| n-Propyl acetate | 40 parts |
| Isopropyl alcohol | 40 parts |

Likewise, a protective overcoat composition of the following formulation was coated on the resulting film to prepare a photosensitive film A with the protective overcoat layer in 1 μm thickness.

| Ingredients | Parts by weight |
|---|---|
| Polyvinylalcohol (Saponification degree: 98.5%, Polymerization degree: 500) | 5 parts |
| Noigen EA-140 (manufactured by Daiichi Kogyo Seiyaku) | 0.2 part |
| Methanol | 5 parts |
| Water | 90 parts |

A test negative film composed of a combination of a step guide with 21 steps (manufactured by Dainihon Screen Co.) and a dot image (150 l/in, halftone dot area ratio: 50%) was put on each resulting photosensitive film and it was exposed to a light for a predetermined period of time by using a bright room printer (manufactured by ORC Co.). Then, after the the protective overcoat layer was removed by washing with water, the film was dipped in 0.75% aqueous Na$_2$CO$_3$ solution adjusted to 30° C. for 10 seconds and rubbed with a sponge while washing with water to develop the film and dried to obtain a reversed image. It was found the the film was hardened by 5th step of the step guide and the negative image was well reproduced by dots.

A reproducing halftone dot image prepared in the same manner as described above was dipped in 5% aqueous hydroquinone solution and washed with water, dried to obtain the image reproducing material A.

Image reproducing material B

The surface of a polyester film (thickness: 100 μm) was washed with water, dried and then aluminum was deposite thereon in a thickness of 500 Å under vacuum of $10^{-6}$ order by a resistance heat type vacuum metallizer.

Next, a photosensitive composition of the following formulation was prepared and coated on the above polyester film having a deposit of aluminum by a reverse roll coater to prepare a photosensitive layer coating in 3 μm thickness.

| Ingredients | Parts by weight |
|---|---|
| Copolymer of Methylmethacrylate (25 mol %), Methacrylic acid (45 mol %) and Laurylmethacrylate (30 mol %) | 15 parts |
| Trimethylolpropane triacrylate | 12 parts |
| Dimedone | 1 part |
| Coumarine | 0.5 part |
| 2-(2-Chloro-1-naphthyl)-4,5-diphenylimidazole dimer | 2.8 parts |
| Hydroquinone monomethyl ether | 0.02 part |
| Acetone | 134 parts |
| Chloroform | 16 parts |
| Methyl alcohol | 26 parts |

Further, a protective overcoat layer was provided on this film in the same manner as in the above image reproducing material A to obtain a photosensitive film B.

According to the same manner as in preparation of the image reproducing material A, the film was exposed to light for 5 seconds. Then, after removal of a protective overcoat layer by washing with water, the film was dipped in 0.75% aqueous solution of Na$_2$CO$_3$ at 30° C. for 10 seconds and an image was developed by rubbing with a sponge while washing with water and the unexposed part of the photosensitive resin layer was removed. Then, it was dipped in the second developer aqueous saturated solution of calcium hydroxide (30° C.) for 3 minutes and washed with water, and again, dipped in 5% aqueous solution of hydroquinone (30° C.) for 15 seconds, washed with water and dried to obtain an image reproducing material B. It was hardened by 5th step of the step guide and the halftone dots reproduced the negatives precisely.

Image reproducing material C

Polyester (100 parts by weight) obtained by condensation polymerization of 2-methyl-2-(N,N-diethylamino)methyl-1,3-propanediol and terephthalic acid in the molecular ratio of 1.1:1 according to a conventional method and diphenylmethane diisocyanate (1, 3, 5 or 7 parts, respectively) were dissolved in benzene (525 parts) and the mixture was stirred at 30° C. for 40 minutes. Then, tribromomethylphenylsulfone (61 parts) was dissolved in the mixture, which was coated on the polyester film with an undercoat layer used for preparing the image reproducing material A, to obtain a photosensitive film C with a photosensitive layer in 5 μm thickness. This film was exposed to light for 20 seconds in the same manner as in preparation of the image reproducing material A.

This film was dipped in the developer which was prepared by dissolving bromophenol blue (0.0066 parts) in a mixture of water and methanol (water/methanol=4/6 by volume) at 20° C. for 180 seconds to develop an image and dried to obtain an image reproducing material C which was colored in enough density by the 4th step and the halftone dots well reproduced the negatives.

Image reproducing material D

Fuji lithocontact film (Trade mark, Fuji film KK) was used as a photosensitive film D. The film was exposed to light for 5 seconds according to the same manner as in preparation of the image reproducing material A. Then, an image was developed with High lithodol, a standard developer for Fuji lithofilm, for 2 minutes at 20° C. with continuous stirring and then dipped in 3% aqueous solution of acetic acid (20° C.) for 20 seconds to quench the reaction. Then, by using acidic hard film fixer Fuji fix (Trade mark, Fuji film KK), fixing was carried out at 20° C. for 3 minutes and then the film was dipped in 2% aqueous solution of sodium nitrite which acted as a washing promotor, washed by running water for 5 minutes and dried at 50° C. by warm air for 30 seconds to prepare image reproducing material D. The step guide was developed by the 3rd to 4th steps and halftone dots well reproduced the negative.

In order to test the effect of the present invention, the treatment solution shown in Table 4 was prepared.

TABLE 4

| Sample No. | Scratch resistance improver | Solvent | Conc. | Method |
| --- | --- | --- | --- | --- |
| 1 | Stearic acid | 1,1,1-trichloro-ethane | 0.1 wt % | E |
| 2 | Stearic acid | 1,1,1-trichloro-ethane | 1.0 | E |
| 3 | Sodium stearate | water | 0.05 | F |
| 4 | Stearyl alcohol | 1,1,1-trichloro-ethane | 0.5 | E |
| 5 | Ethyl stearate | 1,1,1-trichloro-ethane | 0.5 | E |
| 6 | Lauric acid | 1,1,1-trichloro-ethane | 0.5 | E |
| 7 | Lauryl amine | acetone | 0.5 | E |
| 8 | Lauric amide | ethylalcohol | 0.5 | E |
| 9 | Sodium laurate | water | 0.2 | F |
| 10 | Oleic acid | ethylether | 0.2 | E |
| 11 | Palmitic acid | 1,1,1-trichloro-ethane | 0.5 | E |
| 12 | Isopropyl palmitate | ethylalcohol | 0.5 | E |
| 13 | myristis acid | 1,1,1-trichloro-ethane | 0.5 | E |
| 14 | Elaidic acid | ethylether | 0.5 | E |
| 15 | Nonadecanoic acid | ethylether | 0.2 | E |
| 16 | without improver | 1,1,1-trichloro-ethane | — | E |
| 17 | | water | — | F |

The above-obtained image reproducing materials A-D were treated with these treatment solution according to the following two methods (E) and (F). (the method applied is shown in Table 4)

(E) The surface of the image was wiped 5 times with Webril Litho-Pads (Trade Mark of 100% cotton pad manufactured by Kendal Co.) previously dipped in the treatment solution and well wrung and it was air-dried.

(F) The image reproducing material was air-dried after being dipped in the treatment solution at 20° C. for 30 seconds.

The image reproducing material thus treated was subjected to a loaded scratch test as described above. The results were shown in Table 5.

As is seen from Table 5, it was found that surface scratch resistance property of the image was remarkably improved by using the treatment solution of the scratch resistance improver and employing the method of the present invention.

TABLE 5

| Sample No. | Method of treatment | Image reproducing materials | | | |
| --- | --- | --- | --- | --- | --- |
| | | A | B | C | D |
| 1 | E | 200 | 225 | 175 | 275 |
| 2 | E | 275 | 275 | 200 | 300 |
| 3 | F | 200 | 200 | 150 | 225 |
| 4 | E | 200 | 200 | 200 | 275 |
| 5 | E | 125 | 150 | 100 | 175 |
| 6 | E | 250 | 250 | 175 | 275 |
| 7 | E | 150 | 175 | 100 | 225 |
| 8 | E | 100 | 125 | 125 | 200 |
| 9 | F | 225 | 250 | 150 | 200 |
| 10 | E | 325 | 325 | 225 | 300 |
| 11 | E | 250 | 275 | 200 | 275 |
| 12 | E | 200 | 225 | 175 | 250 |
| 13 | E | 225 | 225 | 200 | 250 |
| 14 | E | 275 | 300 | 225 | 300 |
| 15 | E | 325 | 325 | 200 | 300 |
| 16 | E | 8 | 70 | 20 | 150 |
| 17 | F | 8 | 70 | 20 | 100 |

EXAMPLE 5

The photosensitive film A of Example 4 was exposed to light to form an image according to the same manner as in Example 1 and the protective overcoat layer was removed by washing with water. Then, it was dipped in 0.75% aqueous solution of $Na_2Co_3$ containing 0.5% of sodium lauryl sulfate for 10 seconds and developed by rubbing with a sponge while washing with water and dried to obtain the reversed image. The step guide was hardened by the 5th step and the halftone dots well reproduced the negatives. When this image reproducing material was subjected to the loaded scratch resistance test in the same manner as in Example 1, the scratch strength was 150 g. In comparison with the scratch strength of the image reproducing material A developed with the developer containing no sodium lauryl sulfate (8 g), it is apparent that the scratch resistance property was remarkably improved.

What is claimed is:

1. A process for preparing an image reproducing material for a lithofilm said process comprising
    (a) forming a coating composition by admixing scratch resistance improver, photosensitive layer ingredients and coating solvent, said scratch resistance improver being present in an amount ranging from about 0.35 to 10% by weight of the photosensitive layer ingredients, said scratch resistance improver having the formula AmBn wherein A is mono- or divalent, straight or branched $C_{11-20}$ aliphatic hydrocarbon; B is hydroxyl, amino, nitrile, aldehyde, carboxyl, alkylamide, ester of carboxylic acid with $C_{1-3}$ monohydric or polyhydric alcohol, or ammonium salt or a periodic table group I–IV metal salt of a carboxylic acid, m is an integer of 1 to 3; and n is 1 or 2, said photosensitive layer ingredients being such as to provide a photosensitive layer in step (c) with a fluidizing point not higher than 95° C. and comprising monomer containing one or more photopolymerizable double bonds, a photopolymerization initiating amount of photoinitiator, a functional amount of binder which is a solid organic polymeric material at a temperature lower than 50° which has film forming properties in the photosensitive layer formed in step (c), and actinic light absorber to provide an absorbance of 1.5 to 4 in the photosensitive layer formed in step (c);

(b) coating said composition onto a transparent support in amount and thickness to provide a photosensitive layer of thickness of 1 to 6 microns in step (c);

(c) drying coating provided by step (b) so that it contains less than 100 ppm coating solvent to obtain photosensitive layer with scratch resistance improver therein of thickness of 1 to 6 microns and fluidizing point not higher than 95°, whereupon, because of said dried state and because of said fluidizing point, said scratch resistance improver migrates to the surface of the photosensitive layer removed from said support to provide scratch resistance properties thereto.

* * * * *